United States Patent
Chang et al.

(10) Patent No.: US 9,159,832 B2
(45) Date of Patent: Oct. 13, 2015

(54) SEMICONDUCTOR FIN STRUCTURES AND METHODS FOR FORMING THE SAME

(71) Applicant: Taiwan Semiconductor Manufacturing Company, Ltd., Hsin-Chu (TW)

(72) Inventors: Chia-Wei Chang, Taichung (TW); Srisuda Thitinun, Amphur Muang (TH); Ryan Chia-Jen Chen, Chiaya (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/789,831

(22) Filed: Mar. 8, 2013

(65) Prior Publication Data
US 2014/0252428 A1  Sep. 11, 2014

(51) Int. Cl.
| | |
|---|---|
| *H01L 29/76* | (2006.01) |
| *H01L 29/78* | (2006.01) |
| *H01L 29/66* | (2006.01) |
| *H01L 21/8234* | (2006.01) |
| *H01L 21/308* | (2006.01) |

(52) U.S. Cl.
CPC .......... *H01L 29/785* (2013.01); *H01L 21/3083* (2013.01); *H01L 21/823431* (2013.01); *H01L 29/66795* (2013.01); *H01L 29/66818* (2013.01); *H01L 29/7851* (2013.01); *H01L 29/7853* (2013.01); *H01L 29/7854* (2013.01)

(58) Field of Classification Search
CPC ............. H01L 2924/00; H01L 29/785; H01L 29/66666; H01L 29/7827; H01L 29/41791; H01L 29/66795; H01L 29/7855; H01L 29/772
See application file for complete search history.

(56) References Cited

U.S. PATENT DOCUMENTS

| | | | |
|---|---|---|---|
| 7,141,856 B2 * | 11/2006 | Lee et al. ........................ | 257/401 |
| 7,301,210 B2 | 11/2007 | Abadeer et al. | |
| 7,888,751 B2 | 2/2011 | Sawada | |
| 7,989,355 B2 | 8/2011 | Shieh et al. | |
| 8,368,148 B2 | 2/2013 | Inaba | |
| 2005/0156202 A1* | 7/2005 | Rhee et al. .................... | 257/213 |
| 2008/0014699 A1* | 1/2008 | Torek et al. ................... | 438/257 |
| 2009/0035909 A1* | 2/2009 | Chang et al. .................. | 438/276 |

(Continued)

FOREIGN PATENT DOCUMENTS

| | | |
|---|---|---|
| KR | 10-0496891 B1 | 6/2005 |
| KR | 10-2011-0033039 A | 3/2011 |

OTHER PUBLICATIONS

Wu, Banqiu, et al., "High Aspect Ratio Silicon Etch: A Review," Journal of Applied Physics, 108, 051101, 2010, 21 pages.

(Continued)

*Primary Examiner* — Fei Fei Yeung Lopez
(74) *Attorney, Agent, or Firm* — Haynes and Boone, LLP

(57) ABSTRACT

An integrated circuit structure includes a semiconductor substrate, an insulation region extending into the semiconductor substrate, and a semiconductor strip between two opposite portions of the insulation region. The semiconductor strip includes an upper portion higher than top surfaces of the insulation regions and a lower portion in the insulation region. The lower portion has a sidewall including a first sidewall portion having a first slope and a second sidewall portion over and connected to the first sidewall portion. The second sidewall portion has a second slope smaller than the first slope.

19 Claims, 8 Drawing Sheets

(56) References Cited

U.S. PATENT DOCUMENTS

| | | |
|---|---|---|
| 2010/0187575 A1* | 7/2010 | Baumgartner et al. ....... 257/255 |
| 2011/0068405 A1 | 3/2011 | Yuan et al. |
| 2013/0056826 A1* | 3/2013 | Liu et al. ................. 257/347 |
| 2013/0093062 A1* | 4/2013 | Lin et al. ................. 257/622 |
| 2013/0221448 A1* | 8/2013 | Chang et al. ............... 257/401 |
| 2013/0244392 A1* | 9/2013 | Oh et al. .................. 438/299 |
| 2013/0270612 A1* | 10/2013 | Chien et al. ............... 257/288 |

OTHER PUBLICATIONS

Yeom, Junghoon, et al., "Maximum Achievable Aspect Ratio in Deep Reactive Ion Etching of Silicon Due to Aspect Ratio Dependant Transport and the Microloading Effect," Journal of Vaccum Science and Technology, vol. B23, No. 6, Nov./Dec. 2005, pp. 2319-2329.

* cited by examiner

SEMICONDUCTOR FIN STRUCTURES AND METHODS FOR FORMING THE SAME

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFETs) were thus developed. The FinFETs include vertical semiconductor fins above a substrate. The semiconductor fins are used to form source and drain regions and channel regions between the source and drain regions. Shallow Trench Isolation (STI) regions are formed to define the semiconductor fins. The FinFETs also include gate stacks, which are formed on the sidewalls and the top surfaces of the semiconductor fins.

Due to the high density and the high aspect ratio of the fins and the STI regions, the formations of the semiconductor fins and the STI regions face several problems. For example, the pattern loading effect may result in the profiles and the widths of the semiconductor fins to vary significantly from fin to fin, and from wafer to wafer, resulting in a performance variation in FinFETs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Semiconductor fins and the method of forming the same are provided in accordance with various exemplary embodiments. The intermediate stages of forming the semiconductor fins are illustrated. The variations of the embodiments are discussed. Throughout the various views and illustrative embodiments, like reference numbers are used to designate like elements.

Figure 1:
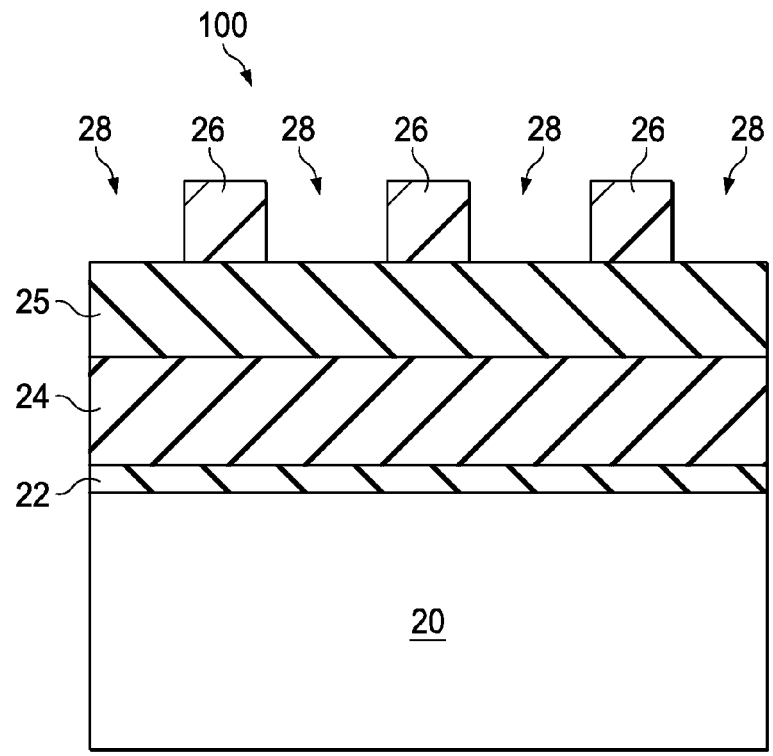
FIGS. 1 through 9 are cross-sectional views of intermediate stages in the manufacturing of semiconductor fins in accordance with some exemplary embodiments.

Referring to FIG. 1, semiconductor substrate 20, which is a part of semiconductor wafer 100, is provided. In some embodiments, semiconductor substrate 20 includes crystalline silicon. Other commonly used materials, such as carbon, germanium, gallium, boron, arsenic, nitrogen, indium, and/or phosphorus, and the like, may also be included in semiconductor substrate 20. Semiconductor substrate 20 may be a bulk substrate or a Semiconductor-On-Insulator (SOI) substrate.

Pad layer 22 and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes.

In some embodiments, additional layers (represented by layer 25) such as an amorphous carbon layer, an oxide layer, or multi-layers thereof, may be formed over mask layer 24. The oxide layer may be formed using PECVD, for example, although other methods such as Atomic Layer Deposition (ALD) may also be used. Patterned mask 26 is formed over mask layer 24 and the additional layers 25, if any, wherein openings 28 are formed in patterned mask 26. In some embodiments, mask layer 26 is formed of a photo resist. In alternative embodiments, patterned mask 26 is formed of other dielectric materials such as oxide, which may be formed using, for example, self-aligned double patterning process. In the self-aligned double patterning process, mandrel patterns (not shown) are first formed, and a conformal dielectric layer is formed and patterned as the spacers on the mandrel patterns. The vertical portions of the dielectric layer form the spacers, which are the patterned mask 26. The horizontal portions of the dielectric layer are removed in the patterning.

Figure 2:
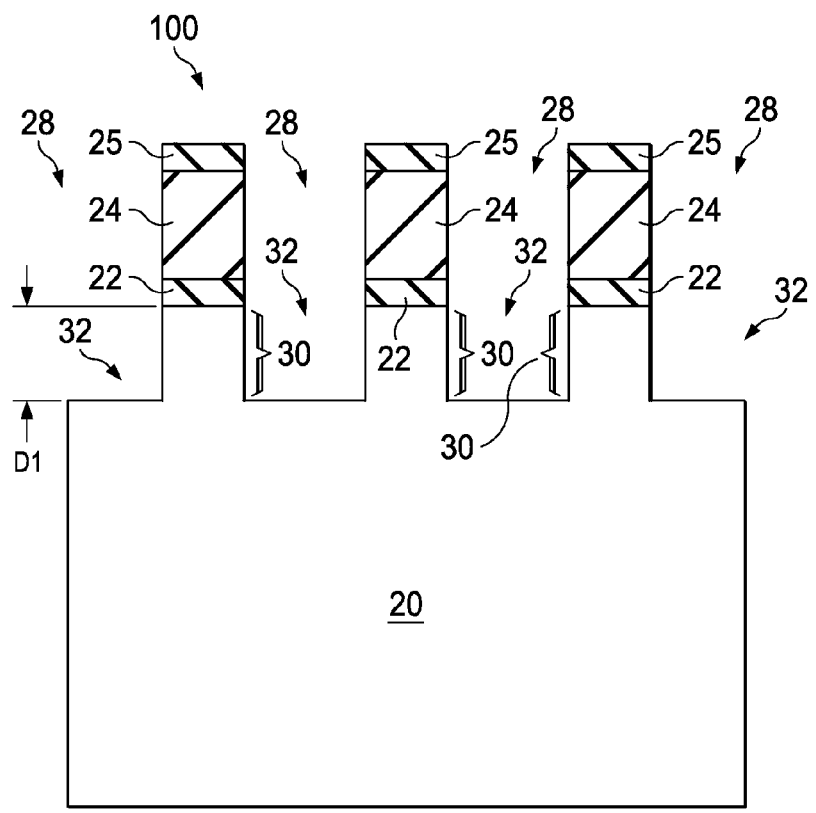
Figure 9:
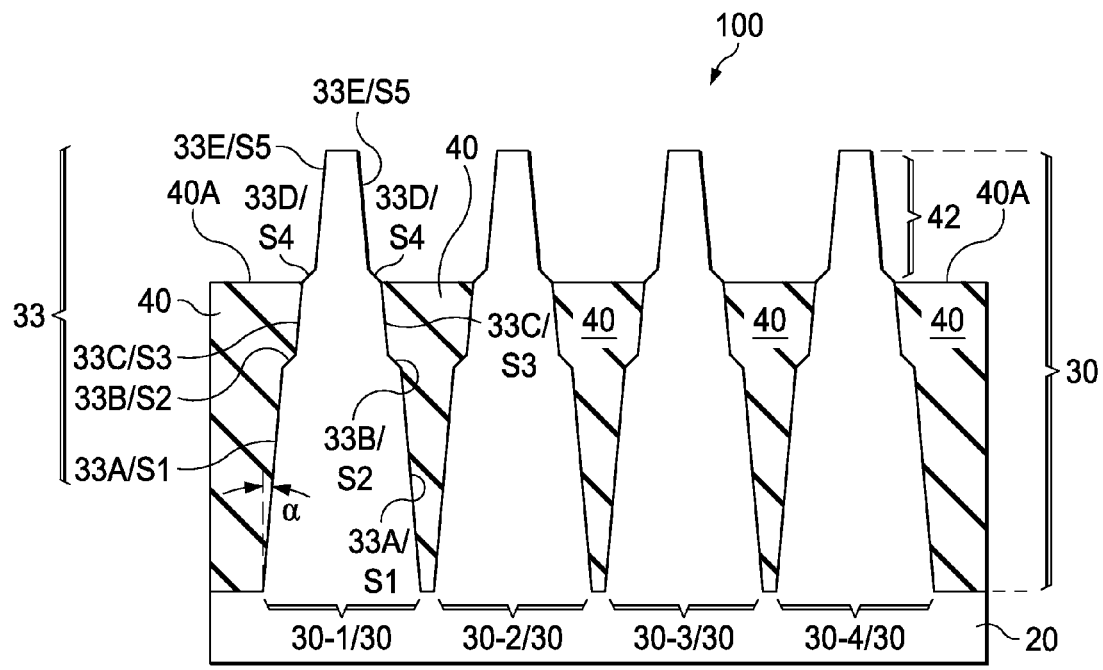

Referring to FIG. 2, layers 22, 24, and 25 are etched through openings 28, exposing underlying semiconductor substrate 20. The exposed semiconductor substrate 20 is then etched, forming trenches 32. The etching step in FIG. 2 is sometimes referred to as a fin etch step since the general sizes and positions of the semiconductor fins 42 (FIG. 9) are defined by this step. As shown in FIG. 2, depth D1 of trenches 32 may be between about 10 nm and about 60 nm. It is appreciated, however, that the values recited throughout the description are merely examples, and may be changed to different values. Depth D1 is also greater than the height of semiconductor fin 42 (FIG. 9). The portions of semiconductor substrate 20 between neighboring trenches 32 form semiconductor strips 30. Trenches 32 may be strips (when viewed in the top view of wafer 100) that are parallel to each other, and closely located from each other. In some embodiments, the etching of semiconductor substrate 20 is performed using, for example, $CF_4$, wherein a dry etching is used.

Figure 3:
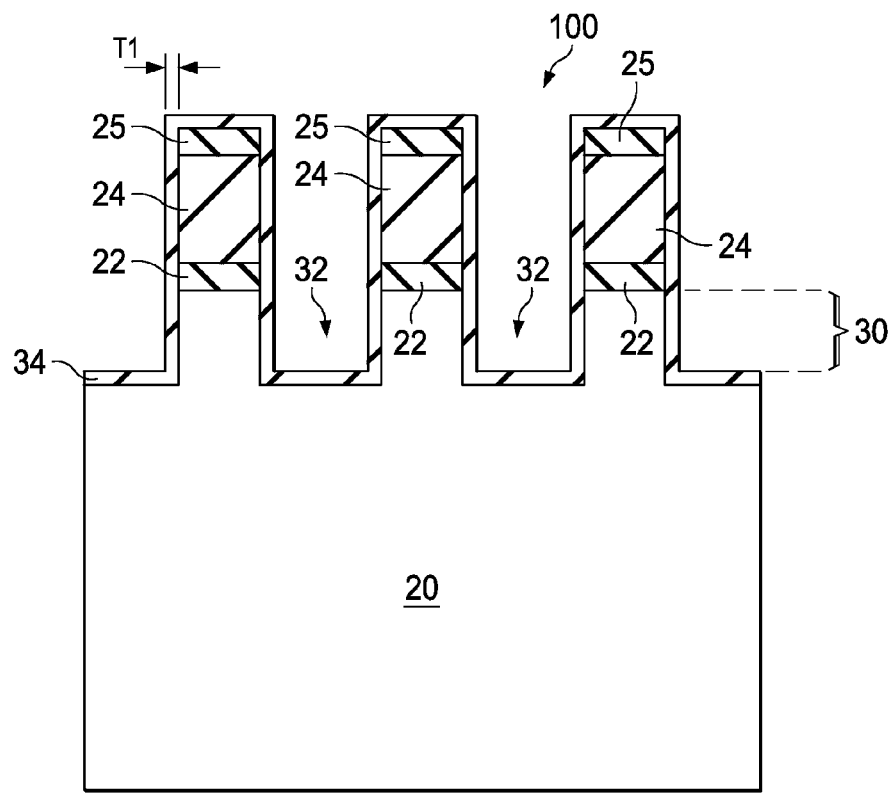

Next, referring to FIG. 3, protection layer 34 is deposited, and is formed on the exposed surfaces of wafer 100. Hence, protection layer 34 includes vertical portions on the sidewalls of layers 22, 24, and 25. Protection layer 34 also includes horizontal portions on the top surface of layer 25 and the exposed top surfaces of semiconductor substrate 20. In some embodiments, protection layer 34 comprises silicon oxide, although other materials that have high etching selectivity values (for example, greater than about 50) may also be used. The etching selectivity is the ratio of the etching rate of substrate 20 to the etching rate of silicon oxide in some embodiments. Protection layer 34 may be a substantially conformal layer, with the thicknesses of its horizontal portions substantially equal to the thicknesses of its vertical portions. Thickness T1 (which may be the thickness of the vertical portions) of protection layer 34 may be between about 1 nm and about 10 nm, for example. In some embodiments, the available methods for forming protection layer 34 include Chemical Vapor Deposition (CVD) methods, Atomic Layer Deposition (ALD), and the like.

Figure 4:
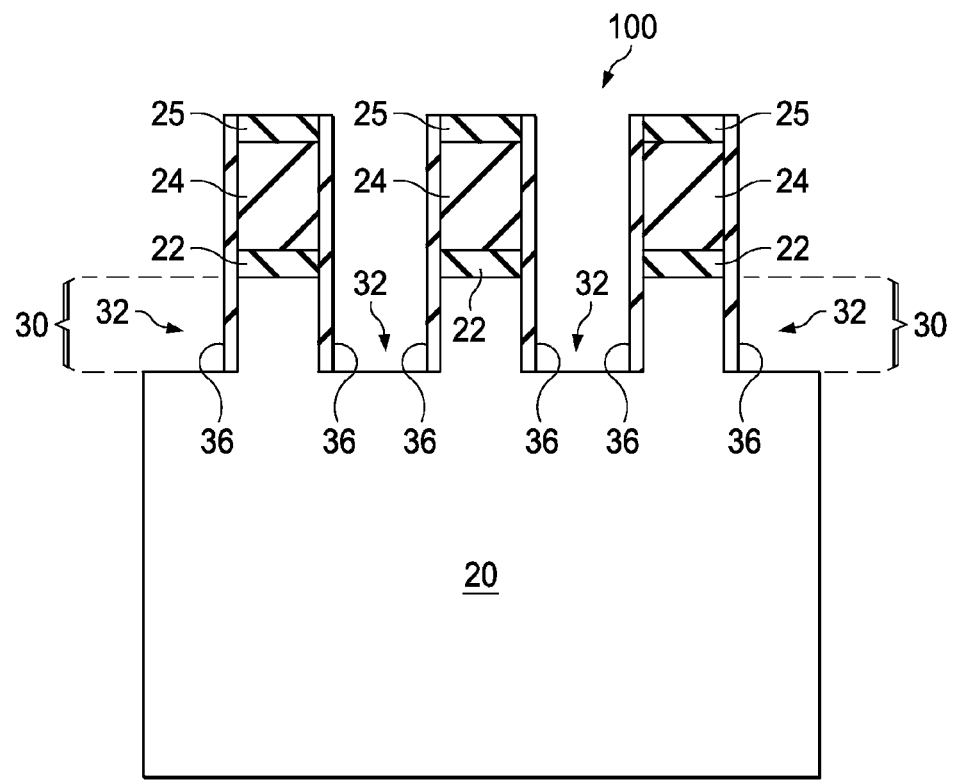

FIG. 4 illustrates the removal of the horizontal portions of protection layer 34. The remaining portions of protection layer 34 (FIG. 3) form spacers 36, which are on the sidewalls of layers 22, 24, and 25 and semiconductor strips 30. In some embodiments, the removal of the horizontal portions of protection layer 34 is achieved using an anisotropic etching process, which may also be a dry etching process in some exemplary embodiments.

Figure 5:
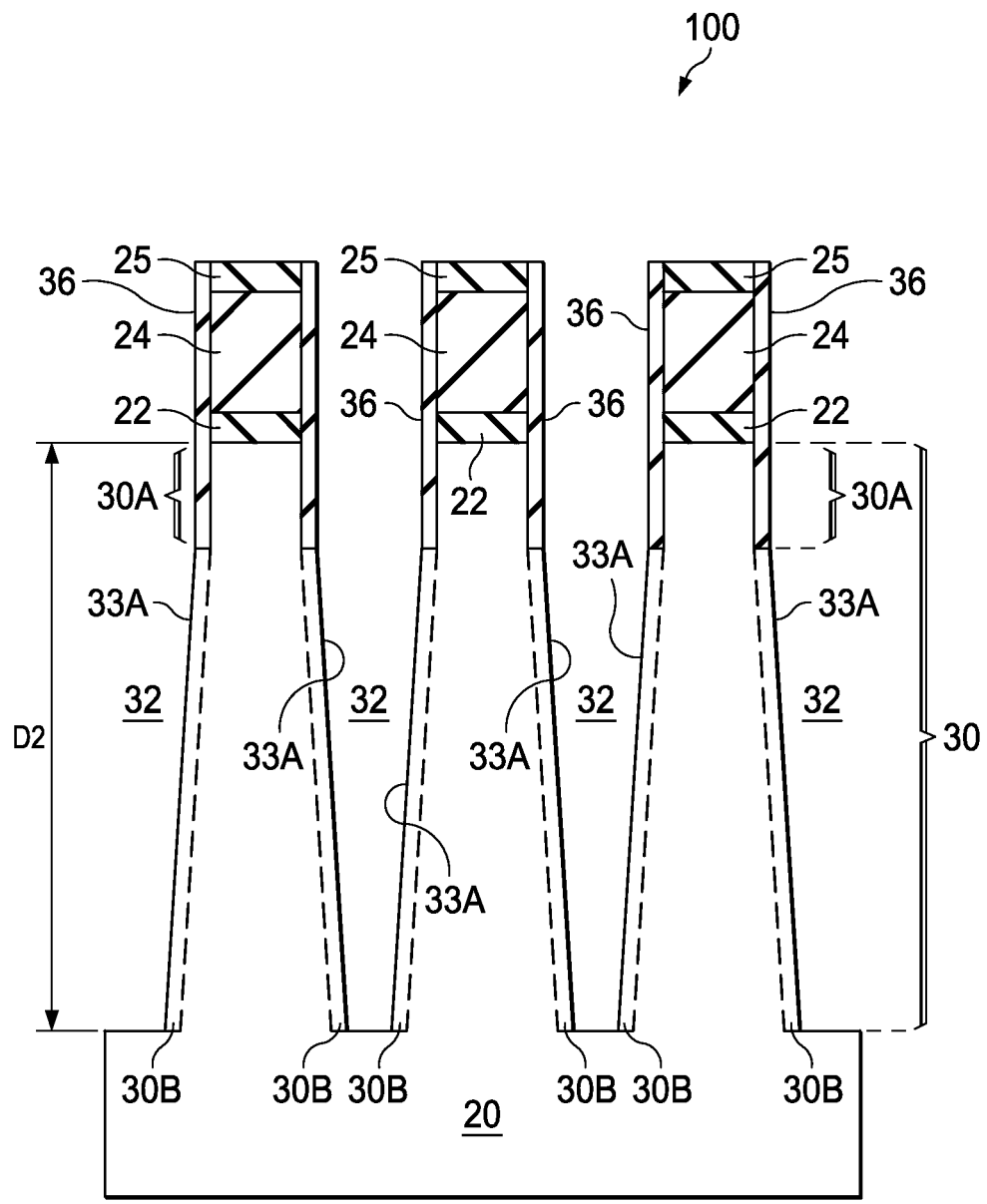

Referring to FIG. 5, a second etching of semiconductor substrate 20 is performed to extend trenches 32 downwardly. The etching step in FIG. 5 is sometimes referred to as Shallow Trench Isolation (STI) etch step since the general sizes and the depths of STI regions 40 (FIG. 8) are defined by this step. Semiconductor strips 30 are also extended downwardly due to the extension of trenches 32. The STI etch step may be performed using an etchant that has an etching selectivity higher than the etching selectivity in the step in FIG. 2, wherein the etching selectivity is the ratio of the etching rate of substrate 20 to the etching rate of spacers 36. Depth D2 of trenches 32 may be between about 60 nm and about 200 nm when the STI etch step is finished. The etching is anisotropic, and hence the portions 30B of semiconductor strips 30, which portions 30B are directly underlying spacers 36, are protected from being etched. Sidewalls 33A of semiconductor strips 30 may be slightly tilted, or may be substantially vertical.

After the etching, a wet clean process is performed to clean the surfaces of the structure in FIG. 5. The wet clean may be performed using chemicals such as sulfuric acid, ammonia water, hydrofluoric acid, and/or the like. During the clean process, spacers 36 protect portions 30B of semiconductor strips 30 from the damage of the chemicals that are used in the wet clean process. Hence, the profiles and the widths of portions 30B are not changed by the wet clean process. Portions 30B of semiconductor strips 30 may be used for forming FinFETs. Therefore, spacers 36 have the function of protect the fins.

Figure 6:
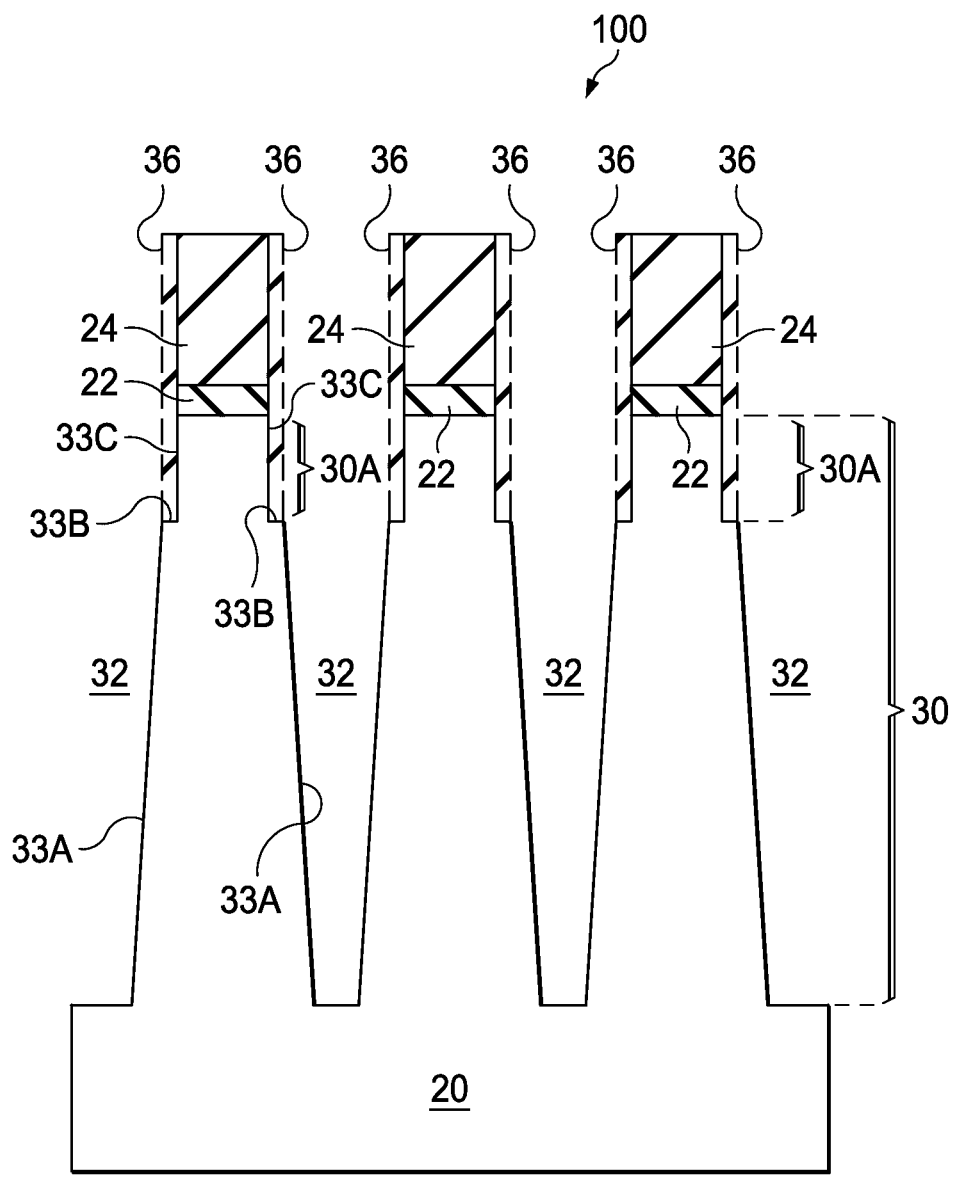

In a subsequent step, spacers 36 are removed, for example, through an etching step, wherein an HF gas or a diluted HF solution may be used. In the embodiments wherein dielectric layer 25 comprises silicon oxide or other materials that are the same as the material of spacers 36, dielectric layer 25 may also be removed. The resulting structure is shown in FIG. 6. In alternative embodiments, spacers 36 are not removed, and are left in the final FinFET. As shown in FIG. 6, since portions 30A of semiconductor strips 30 are protected by spacers 36 from the etching of substrate 20, the sidewalls of semiconductor strips 30 may have discontinuity, wherein sidewall portions 30A and sidewall portions 33C are discontinued, and are connected by sidewall portions 30B that have smaller slopes than sidewall portions 33A and 33C.

Figure 7:
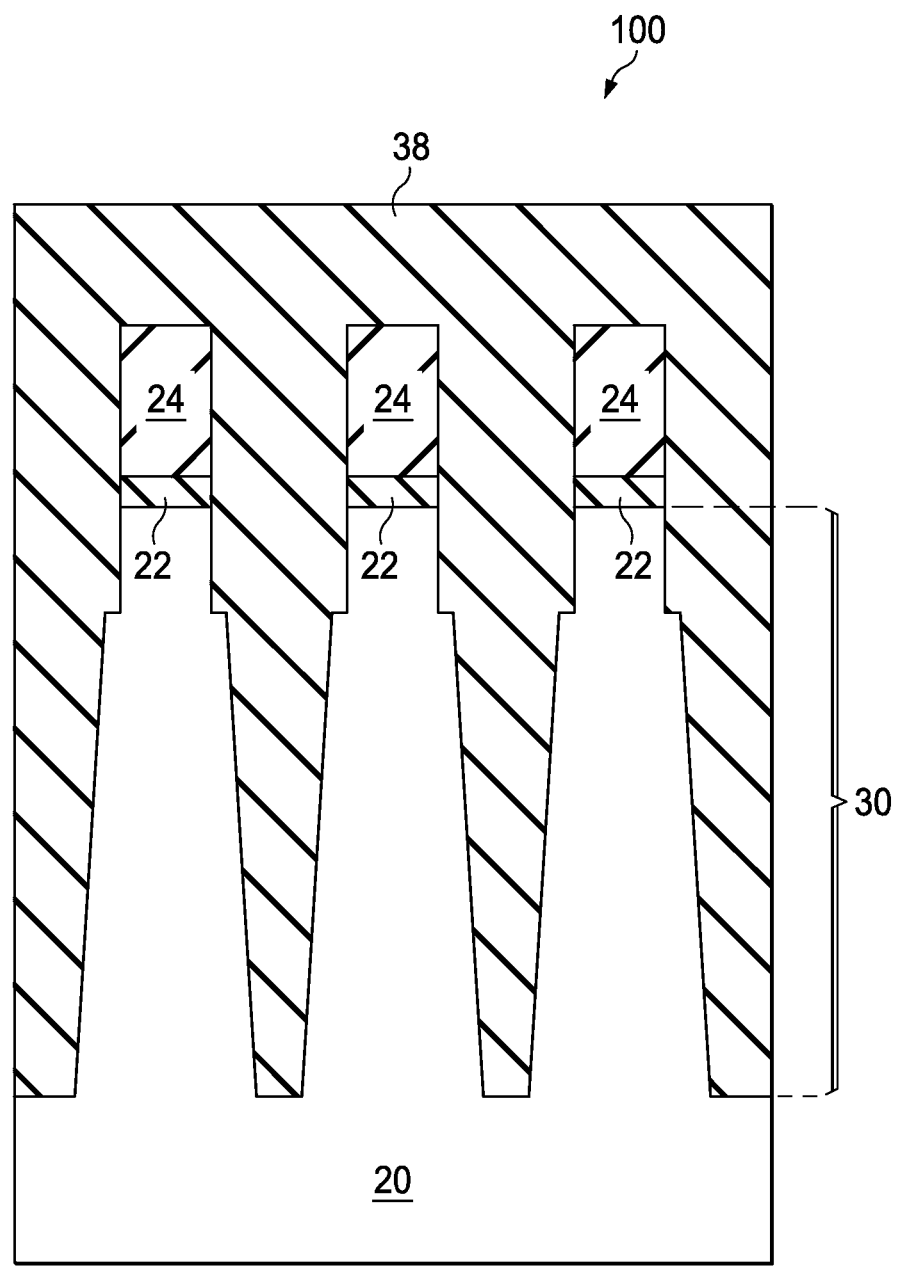

FIG. 7 illustrates the filling of dielectric material 38. In accordance with some embodiments, dielectric material 38 includes a liner oxide (not shown) formed in trenches 32 (FIG. 6) and on the sidewalls of semiconductor strips 30. The liner oxide may be a thermal oxide having a thickness between about 10 Å to about 100 Å, for example. The remaining portions of trenches 32 are also filled by dielectric material 38, which is filled to a level higher than the top surfaces of mask layer 24. The formation method of dielectric material 38 may be selected from Chemical Vapor Deposition (CVD), ALD, Flowable Chemical Vapor Deposition (FCVD), High Aspect-Ratio Process (HARP), High-Density Plasma CVD (HDPCVD), and the like.

Figure 8:
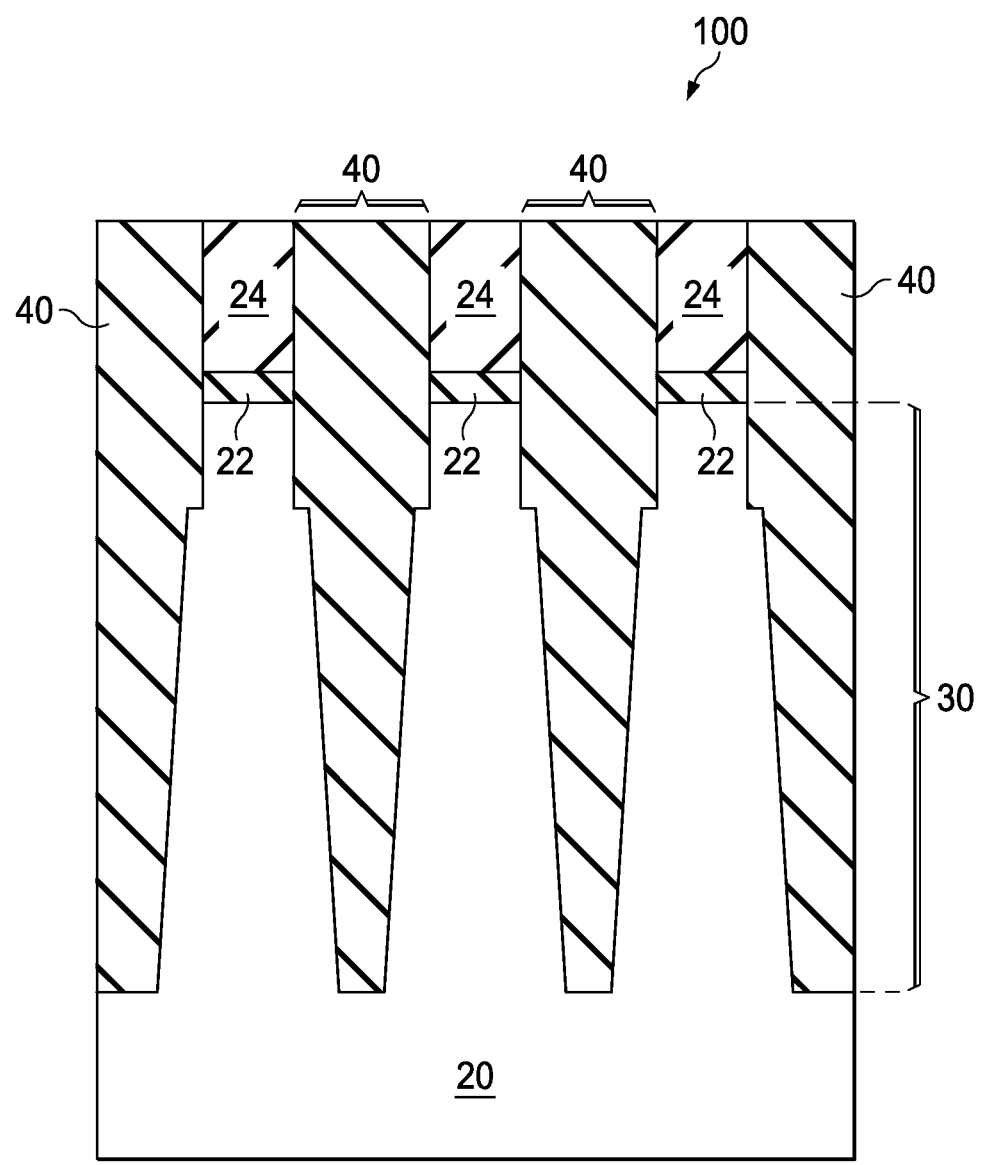

A planarization such as a Chemical Mechanical Polish (CMP) process is then performed, as shown in FIG. 8, and hence STI regions 40 are formed, which include the remaining portions of dielectric material 38. During the CMP, mask layer 24 is used as the CMP stop layer, and hence the top surface of mask layer 24 is substantially level with the top surfaces of STI regions 40.

Mask layer 24 is then removed. Mask layer 24, if formed of silicon nitride, may be removed in a wet process using hot $H_3PO_4$. Next, as also shown in FIG. 9, STI regions 40 are recessed, and pad layer 22 is also removed. The portions of semiconductor strips 30 protruding over the top surfaces of the remaining STI regions 40 become semiconductor fins 42. The recessing of STI regions 40 may be performed using a dry etch process or a wet etch process. In some embodiments, the recessing of STI regions 40 is performed using a dry etch method, in which the process gases including $NH_3$ and HF are used. In alternative embodiments, the recessing of STI regions 40 is performed using a wet etch method, in which the etchant solution includes $NF_3$ and HF. In yet other embodiments, the recessing of STI regions 40 is performed using a dilution HF solution, which may have an HF concentration lower than about 1 percent.

As shown in FIG. 9, the sidewall 33 (including portions 33A, 33B, 33C, 33D, and 33E) of a semiconductor strip 30 may include two transition regions. The first transition region is at a level below the top surfaces 40A of STI regions 40. The first transition region includes sidewall portions 33A, 33C, and sidewall portions 33B interconnecting portions 33A and 33C. Sidewall portions 33C have top ends substantially level with the top surfaces of STI regions 40A. Sidewall portions 33A, 33B, and 33C have slopes S1, S2, and S3, respectively. The majority (for example, over about 80 percent or 90 percent) of each of sidewall portions 33A, 33B, and 33C may have a substantially uniform slope, which is equal to S1, S2, and S3, respectively. Throughout the description, the slope of a sidewall portion is the cotangent of the tilt angle of the respective sidewall portion, wherein the tilt angle is formed between the respective sidewall portion and a vertical line. For example, sidewall portion 33A has slant angle α, and the slope S1 of sidewall portion 33A is the cotangent of tilt angle α, Hence, the more vertical a sidewall portion is, the greater the slope is, and vice versa.

In accordance with some embodiments, due to the formation of spacers 36 (FIG. 5), which protect the underlying portions 30B (FIG. 5) of semiconductor strips 30 during the STI etch step, slope S2 is smaller than both slopes S1 and S3. In some embodiments, slope S2 is between about 0.5 and about 2, and slopes S1 and S3 are greater than about 30. Slopes S1 and S3 may also be greater than about 30. Furthermore, ratio S2/S1 and ratio S2/S3 may be smaller than about 2/3. Hence, in the first transition region, sidewalls 33A, 33B, and 33C are not continuous. Slopes S1 and S3 may be substantially equal to each other, although they may also be different from each other. Alternatively, slope S1 is smaller than slope S3.

The second transition region is at a level close to top surfaces 40A of STI regions 40. The second transition region includes sidewall portions 33C, 33E, and sidewall portions 33D connecting 33C and 33E. Sidewall portions 33D have bottom ends connected to the top ends of sidewall portions 33C. Furthermore, the bottom ends of sidewall portions 33D may be substantially level with the top surfaces 40A of STI regions 40. Sidewall portions 33C, 33D, and 33E have slopes S3, S4, and S5, respectively. The majority (for example, over 80 percent or 90 percent) of each of sidewall portions 33D and sidewall portions 33E may have a substantially uniform slope, which are equal to S4 and S5, respectively. In accordance with some embodiments, due to the etching of fins 42 during the recessing of STI regions 40, and further because the portions of semiconductor strips 30 embedded in STI regions 40 are not etched in the STI etch step (which is shown in FIG. 5), slope S4 is smaller than both slopes S3 and S5. In some embodiments, slope S4 is between about 0.5 and about 3, and slopes S3 and S5 are greater than about 30. Furthermore, ratio S4/S3 and ratio S4/S5 may be smaller than about 0.1. Hence, in the second transition region, sidewalls 33C, 33D, and 33E are not continuous.

In the embodiments in FIG. 9, the edge strips 30-1 and 30-4, which are the outmost strips of a group of closely located strips 30, have a substantially symmetric profile, with the opposite sidewalls of the same strip both include two transition regions. In addition, the inner strips 30-2 and 30-3 also have symmetric profiles. In alternative embodiments, edge strips 30-1 and 30-4 may have non-symmetric sidewalls. For example, in FIG. 10, the left sidewall of edge strip 30-1 has two transition regions, while the right sidewall of edge strip 30-1 has the transition region at top surfaces 40A of STI regions 40, and does not have the transition region inside STI regions 40. The inner strips such as strips 30-2 and 30-3 may have two transition regions in each of the opposite sidewalls.

Figure 11:
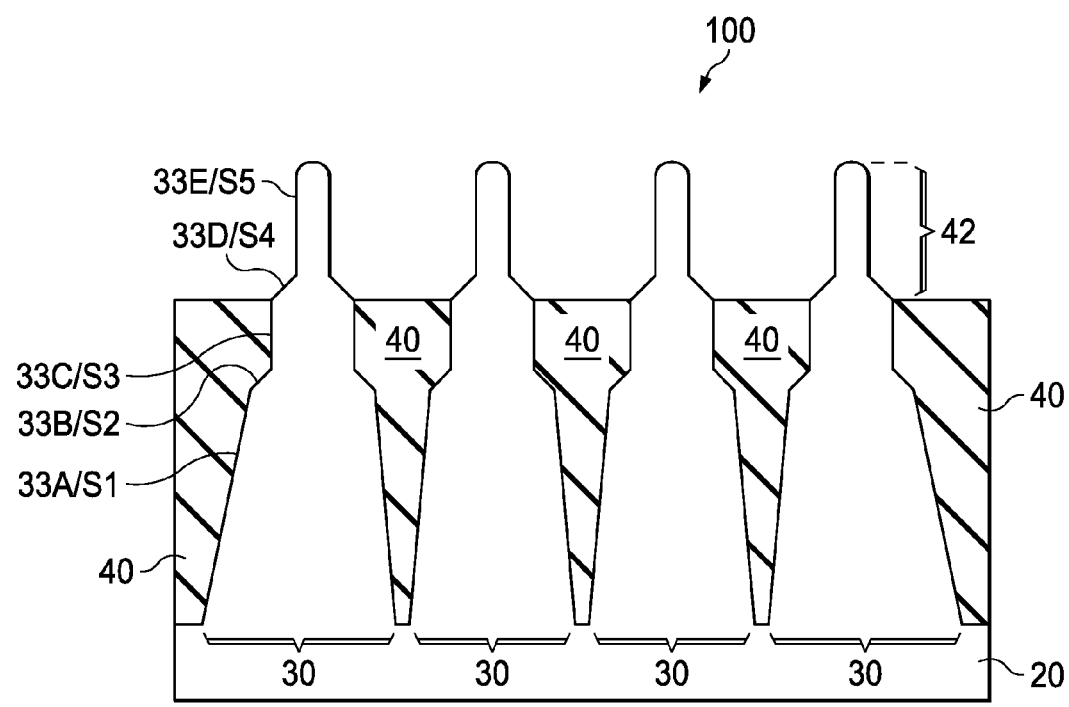

FIG. 11 illustrates some embodiments similar to the embodiments in FIG. 9, except that the slopes of the sidewalls of strips 30 are more vertical than in FIG. 9. In the embodiments shown in FIG. 11, sidewalls 33E are substantially vertical, while sidewalls 33A are sloped.

Figure 10:
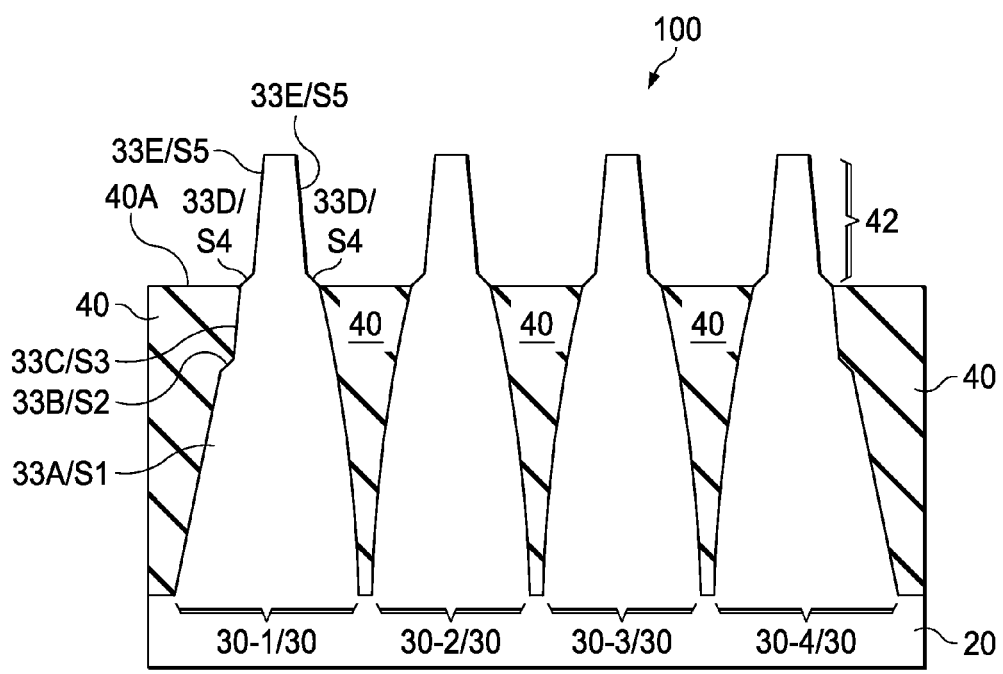
FIGS. 10 and 11 illustrate the cross-sectional views of semiconductor fins having different profiles in accordance with some alternative embodiments.
Figure 12:
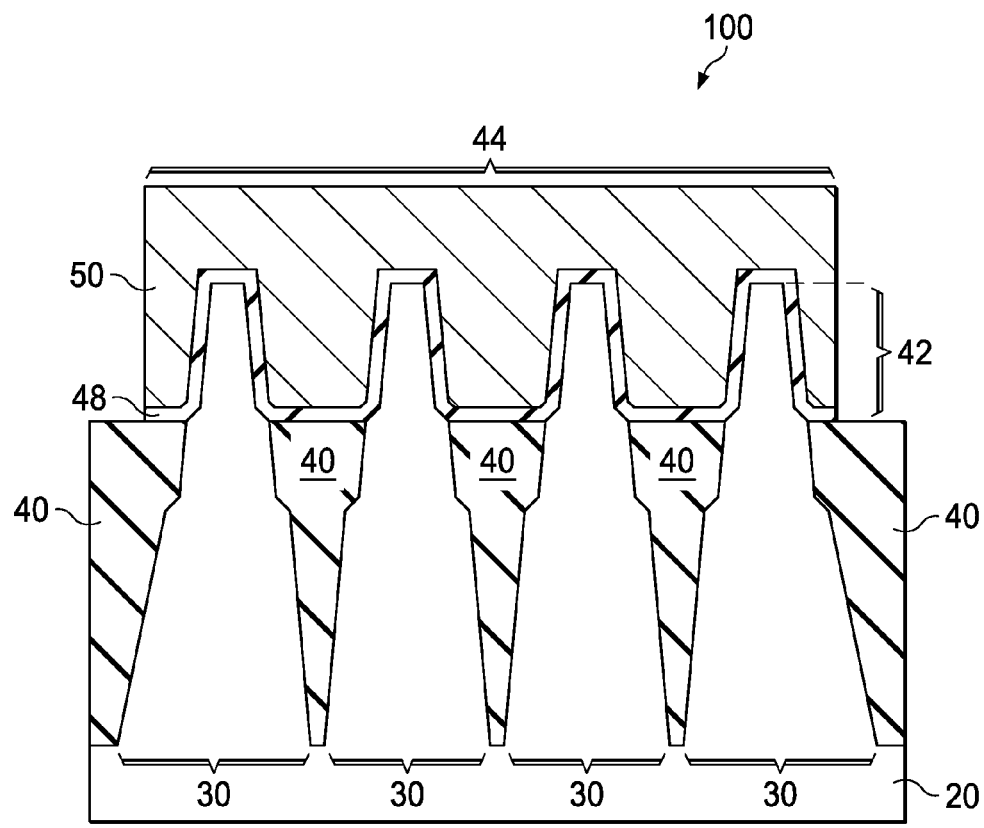
FIG. 12 illustrates a cross-sectional view of a Fin Field-Effect Transistor (FinFET) in accordance with some exemplary embodiments.

FIG. 12 illustrates the formation of FinFETs 44, which may be formed from the structure shown in either one of FIGS. 9 through 11. As shown in FIG. 12, gate dielectric 48 is formed to cover the top surfaces and sidewalls of fins 42. Gate dielectric 48 may be formed through a thermal oxidation process, and hence may include thermal silicon oxide. Alternatively, gate dielectric 48 may be formed through a deposition step, and may comprise high-k dielectric materials. Gate electrode 50 is then formed on gate dielectric 48. In some embodiments, gate electrode 50 covers more than one fin 42, so that the resulting FinFET 44 comprises more than one fin 42. In alternative embodiments, each of fins 42 may be used to form one FinFET. The remaining components of the FinFET 44, including source and drain regions and source and drain silicide regions (not shown), are then formed. The formation processes of these components are known in the art, and hence are not repeated herein. Gate dielectric 48 and gate electrode 50 may be formed using a gate-first approach or a gate last approach. The details of the gate-first approach or a gate-last approach are not described herein.

In accordance with the embodiments of the present disclosure, by forming sidewall spacers, the sidewall profile of the fins that are used for forming FinFETs are protected from the attack in the clean steps. In addition, with the protection of spacers on opposite sides of the fins, if a line cut technique is used, in which the edge fins of a fin group are removed after their formation, the spacers may also protect the inner fins, which are not cut, from the damage caused by additional cleaning processes that are performed after the fin cut.

In accordance with some embodiments, an integrated circuit structure includes a semiconductor substrate, an insulation region extending into the semiconductor substrate, and a semiconductor strip between two opposite portions of the insulation region. The semiconductor strip includes an upper portion higher than top surfaces of the insulation regions and a lower portion in the insulation region. The lower portion has a sidewall including a first sidewall portion having a first slope and a second sidewall portion over and connected to the first sidewall portion. The second sidewall portion has a second slope smaller than the first slope.

In accordance with other embodiments, an integrated circuit structure includes a semiconductor substrate, an STI region extending into the semiconductor substrate, and a semiconductor strip between opposite portions of the STI region. The semiconductor strip has a sidewall on a side of the semiconductor strip. The sidewall includes a first sidewall portion having a first slope, a second sidewall portion over the first sidewall portion and having a second slope, and a third sidewall portion over the second sidewall portion and having a third slope. The second sidewall portion interconnects the first and the third sidewall portions, and wherein the second slope is smaller than the first and the third slopes.

In accordance with yet other embodiments, a method includes etching a semiconductor substrate to form a semiconductor strip, wherein trenches are formed in the semiconductor substrate, and wherein the trenches are on opposite sidewalls of the semiconductor strip. A spacer is formed on a sidewall of the semiconductor strip. The method further includes using the spacer as an etching mask to extend the trenches down into the semiconductor substrate, wherein the semiconductor substrate is etched. A dielectric material is filled into the trenches. The dielectric material is planarized to form insulation regions in the trenches. The insulation regions are recessed. After the recessing, top surfaces of the insulation regions are lower than a top surface of the semiconductor strip.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   an insulation region extending into a semiconductor substrate; and
   a semiconductor strip between two opposing portions of the insulation region, wherein the semiconductor strip comprises:
      a lower portion in the insulation region, wherein the lower portion comprises a sidewall comprising:
         a first sidewall portion having a first slope;
         a second sidewall portion over and connected to the first sidewall portion, wherein the second sidewall portion has a second slope smaller than the first slope; and
      an upper portion higher than a top surface of the insulation region, wherein the upper portion comprises an additional sidewall comprising:
         a third sidewall portion having a third slope, wherein the third sidewall portion has a first end terminating on a top surface of the insulation region and a second end terminating at a distance above the top surface of the insulation region; and
         a fourth sidewall portion over and directly connected to the second end of the third sidewall portion, wherein the fourth sidewall portion has a fourth slope greater than the third slope, and wherein the second sidewall portion and the third sidewall portion tilt to a same direction.

2. The integrated circuit structure of claim 1, wherein the sidewall of the lower portion further comprises a fifth sidewall portion between and joining the second sidewall portion and the third sidewall portion over and connected to the second sidewall, wherein the fifth sidewall portion has a fifth slope greater than the second slope and the third slope.

3. The integrated circuit structure of claim 2, wherein the fifth sidewall portion has a top end substantially level with the top surface of the insulation region.

4. The integrated circuit structure of claim 1, wherein the first sidewall portion and the second sidewall portion are in contact with the insulation region.

5. The integrated circuit structure of claim 1, wherein the first slope is greater than about 30, and wherein the second slope is between about 0.5 and about 2.0.

6. The integrated circuit structure of claim 1 further comprising: a gate dielectric in contact with a top surface and sidewalls of the upper portion of the semiconductor strip; and a gate electrode over the gate dielectric.

7. An integrated circuit structure comprising:
a Shallow Trench Isolation (STI) region extending into a semiconductor substrate; and
a semiconductor strip between opposite portions of the STI region, wherein the semiconductor strip comprises a sidewall on a side of the semiconductor strip, and wherein the sidewall comprises:
a first sidewall portion having a first slope;
a second sidewall portion over the first sidewall portion and having a second slope;
a third sidewall portion over the second sidewall portion and having a third slope, wherein the second sidewall portion interconnects the first and the third sidewall portions, and wherein the second slope is smaller than the first and the third slopes;
a fourth sidewall portion having a fourth slope, wherein the fourth sidewall portion has a bottom end substantially level with a top surface of the STI region, and the fourth sidewall portion is joined to the third sidewall portion and wherein the third sidewall portion and the fourth sidewall portion tilt to a same direction; and
a fifth sidewall portion over the fourth sidewall portion and having a fifth slope greater than the fourth slope; and
wherein the semiconductor strip further comprises an addition sidewall opposite to the sidewall, wherein portions of the additional sidewall that are below the top surface of the STI region are non-symmetric to the first sidewall portion, the second sidewall portion, and the third sidewall portion.

8. The integrated circuit structure of claim 7, wherein the second sidewall portion is lower than the top surface of the STI region.

9. The integrated circuit structure of claim 8, wherein a top end of the third sidewall portion is substantially level with the top surface of the STI region.

10. The integrated circuit structure of claim 7 further comprising:
a gate dielectric in contact with a top surface of the semiconductor strip, wherein the gate dielectric is in contact with the fourth sidewall portion and the fifth sidewall portion; and a gate electrode over the gate dielectric.

11. The integrated circuit structure of claim 7, wherein the first slope is smaller than the third slope.

12. The integrated circuit structure of claim 7, wherein a majority of each of the first sidewall portion, the second sidewall portion, and the third sidewall portion has a substantially uniform slope equal to the first slope, the second slope, and the third slope, respectively.

13. An integrated circuit structure comprising:
a semiconductor substrate;
an insulation region extending into the semiconductor substrate; and
a semiconductor strip between two opposite portions of the insulation region, wherein the semiconductor strip comprises:
an upper portion higher than top surfaces of the insulation regions and having a top surface and a sidewall extending from the top surface the sidewall having at least two different slopes; and
a lower portion in the insulation region, wherein the lower portion comprises a first sidewall and a second sidewall opposite to the first sidewall, wherein the first sidewall comprises:
a first sidewall portion having a first slope; and
a second sidewall portion over and connected to the first sidewall portion, wherein the second sidewall portion has a second slope smaller than the first slope; and
a third sidewall portion over the second sidewall portion and having substantially the first slope, wherein the second sidewall portion interconnects the first and the third sidewall portions, and the second slope is smaller than the first slope; and
wherein the sidewall of the upper portion having the at least two different slopes comprises:
a fourth sidewall portion having a fourth slope, wherein the fourth sidewall portion has a bottom end substantially level with a top surface of the STI region, wherein the fourth sidewall portion is joined to the third sidewall portion, and wherein the fourth sidewall portion and the third sidewall portion tilt to a same direction; and
a fifth sidewall portion over the fourth sidewall portion and having a fifth slope greater than the fourth slope; and
a gate structure formed on the upper portion and interfacing the sidewall having at least two different slopes.

14. The integrated circuit structure of claim 13 comprising a plurality of semiconductor strips, with the semiconductor strip being an outmost strip of the plurality of strips.

15. The integrated circuit structure of claim 14, wherein inner strips of the plurality of semiconductor strips have opposite symmetric sidewalls.

16. The integrated circuit structure of claim 1, wherein the lower portion of the semiconductor strip further comprises an addition sidewall opposite to the sidewall, and the additional sidewall is non-symmetric to the sidewall of the lower portion of the semiconductor strip.

17. The integrated circuit structure of claim 2, wherein the fifth sidewall portion has substantially the same slope as the first sidewall portion.

18. The integrated circuit structure of claim 13, wherein the gate structure includes
a gate dielectric on the top surface of the upper portion, the fourth sidewall portion and the fifth sidewall portion; and a gate electrode is disposed over the gate dielectric.

19. The integrated circuit structure of claim 7 further comprising:
a gate dielectric on a top surface of the semiconductor strip, wherein the gate dielectric is on the fourth sidewall portion and the fifth sidewall portion; and a gate electrode is disposed over the gate dielectric.

* * * * *